United States Patent
Kozono et al.

(10) Patent No.: US 12,321,565 B2
(45) Date of Patent: Jun. 3, 2025

(54) DISPLAY CONTROL DEVICE, DISPLAY CONTROL METHOD AND DISPLAY CONTROL PROGRAM

(71) Applicant: TOYOTA JIDOSHA KABUSHIKI KAISHA, Toyota (JP)

(72) Inventors: Yuki Kozono, Okazaki (JP); Shu Nakajima, Toyota (JP); Takeshi Nawata, Iwakura (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 17/463,299

(22) Filed: Aug. 31, 2021

(65) Prior Publication Data

US 2022/0083201 A1    Mar. 17, 2022

(30) Foreign Application Priority Data

Sep. 15, 2020   (JP) ................. 2020-154364

(51) Int. Cl.
| | |
|---|---|
| *G06F 3/04817* | (2022.01) |
| *B60K 35/00* | (2024.01) |
| *B60K 35/10* | (2024.01) |
| *B60K 35/23* | (2024.01) |
| *B60K 35/29* | (2024.01) |
| *B60K 35/81* | (2024.01) |

(52) U.S. Cl.
CPC .......... *G06F 3/04817* (2013.01); *B60K 35/00* (2013.01); *B60K 35/10* (2024.01); *B60K 35/23* (2024.01); *B60K 35/29* (2024.01); *B60K 35/81* (2024.01); *B60K 2360/119* (2024.01); *B60K 2360/186* (2024.01)

(58) Field of Classification Search
None
See application file for complete search history.

(56) References Cited

U.S. PATENT DOCUMENTS

| | | | | | |
|---|---|---|---|---|---|
| 5,764,139 | A  | * | 6/1998  | Nojima    | G07C 5/0825 701/1 |
| 8,122,384 | B2 | * | 2/2012  | Partridge | G06F 3/04883 715/863 |
| 8,139,040 | B2 | * | 3/2012  | Kong      | G06F 3/04166 345/173 |
| 8,775,023 | B2 | * | 7/2014  | Frojdh    | G06F 3/0304 701/41 |

(Continued)

FOREIGN PATENT DOCUMENTS

| | | |
|---|---|---|
| EP | 1 841 187 A1     | 10/2007 |
| JP | 2002041216 A  *  | 2/2002  |

(Continued)

*Primary Examiner* — William L Bashore
*Assistant Examiner* — Koorosh Nehchiri
(74) *Attorney, Agent, or Firm* — Oliff PLC

(57) ABSTRACT

A display control device that includes: a memory; and a processor that is coupled to the memory, the processor being configured to in a case in which a contact with, or a movement adjacent to, any of a plurality of operating portions provided inside a vehicle cabin is detected, display information corresponding to that operating portion on a display portion inside the vehicle cabin, and, in a case in which a contact with, or a movement adjacent to, two or more of the operating portions is detected, arbitrate the displaying of information on the display portion.

17 Claims, 12 Drawing Sheets

(56) References Cited

U.S. PATENT DOCUMENTS

| | | | |
|---|---|---|---|
| 9,238,409 B2* | 1/2016 | Lathrop | B60K 37/06 |
| 10,569,653 B2* | 2/2020 | Wan | B60K 37/06 |
| 10,780,909 B2* | 9/2020 | Aerts | G06F 3/016 |
| 2007/0287494 A1* | 12/2007 | You | G06F 3/0219 |
| | | | 455/550.1 |
| 2008/0122796 A1* | 5/2008 | Jobs | H04M 1/72403 |
| | | | 345/173 |
| 2009/0164062 A1* | 6/2009 | Aoki | B60Q 1/0082 |
| | | | 701/36 |
| 2012/0283894 A1* | 11/2012 | Naboulsi | G08B 21/06 |
| | | | 701/1 |
| 2013/0038437 A1* | 2/2013 | Talati | G06F 9/542 |
| | | | 340/438 |
| 2013/0257740 A1* | 10/2013 | You | H04M 1/23 |
| | | | 345/168 |
| 2014/0058584 A1* | 2/2014 | Weng | G06F 3/038 |
| | | | 701/1 |
| 2015/0066245 A1* | 3/2015 | Lee | B60W 50/10 |
| | | | 701/2 |
| 2016/0152180 A1* | 6/2016 | Kirsch | B60Q 1/346 |
| | | | 701/36 |
| 2018/0273050 A1* | 9/2018 | Tertoolen | G06F 3/013 |
| 2021/0107527 A1* | 4/2021 | Karve | B60W 40/08 |
| 2021/0252979 A1* | 8/2021 | Pomytkin | G06F 3/04815 |

FOREIGN PATENT DOCUMENTS

| | | | |
|---|---|---|---|
| JP | 2004217179 A | * | 8/2004 |
| JP | 2005096519 A | * | 4/2005 |
| JP | 2007-186148 A | | 7/2007 |
| JP | 2007-290562 A | | 11/2007 |
| JP | 2014-167868 A | | 9/2014 |
| KR | 20180032436 A | * | 4/2018 |

* cited by examiner

DISPLAY CONTROL DEVICE, DISPLAY CONTROL METHOD AND DISPLAY CONTROL PROGRAM

CROSS-REFERENCE TO RELATED APPLICATION

This application is based on and claims priority under 35 USC 119 from Japanese Patent Application No. 2020-154364 filed on Sep. 15, 2020, the disclosure of which is incorporated by reference herein.

BACKGROUND

Technical Field

The present disclosure relates to a display control device, a display control method, and a display control system.

Related Art

Technology in which, in a case in which a plurality of steering switches are operated simultaneously, outputs are decided based on priority levels established in a table is disclosed in Japanese Unexamined Patent Application Laid-Open (JP-A) No. 2005-96519.

In a case in which it is detected that a finger has made contact with, or has been moved adjacent to a plurality switches at the same time, if information corresponding to each of those switches is displayed on a screen, then there is a possibility that a vehicle occupant will experience a sense of being overwhelmed by information, and may fail to correctly recognize the information on the display.

SUMMARY

An aspect of the disclosure is a display control device that includes a memory, and a processor that is coupled to the memory, the processor being configured to in a case in which a contact with, or a movement adjacent to, any of a plurality of operating portions provided inside a vehicle cabin is detected, display information corresponding to that operating portion on a display portion inside the vehicle cabin, and, in a case in which a contact with, or a movement adjacent to, two or more of the operating portions is detected, arbitrate the displaying of information on the display portion.

BRIEF DESCRIPTION OF THE DRAWINGS

Exemplary embodiments of the present disclosure will be described in detail based on the following figures, wherein.

DETAILED DESCRIPTION

Figure 1:
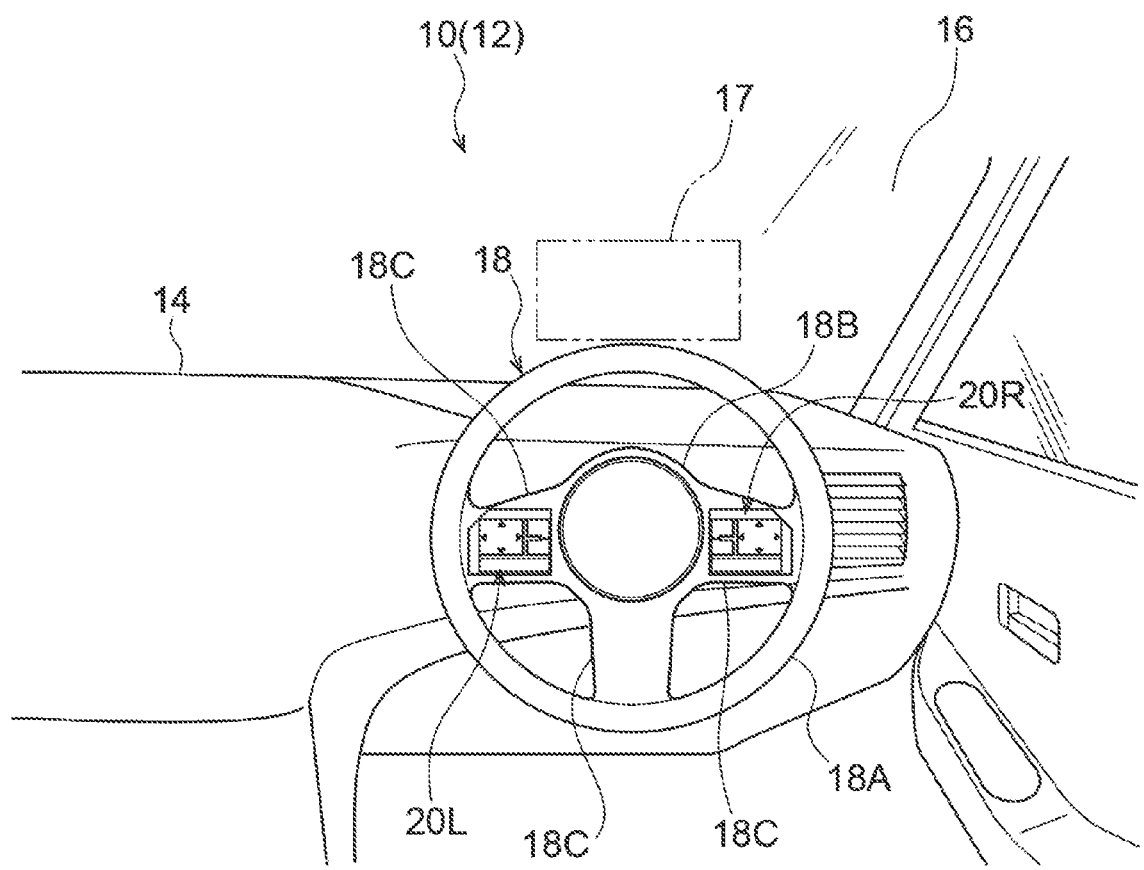
FIG. 1 is a view as seen from a vehicle rearward side of a vehicle cabin front portion of a vehicle in which a display control device according to an exemplary embodiment has been applied.

Hereinafter, an example of an exemplary embodiment of the present disclosure will be described with reference to the drawings. Note that the same reference symbols are used for component elements and portions that are the same or equivalent in the respective drawings. In addition, in some cases, dimensional proportions in the drawings have been exaggerated in order to simplify the description and may not reflect actual dimensions.

A display control device 10 according to an exemplary embodiment of the present disclosure will now be described with reference to the drawings. As is shown in FIG. 1, an instrument panel 14 is installed in a vehicle cabin front portion of a vehicle 12 in which the display control device 10 of the present exemplary embodiment has been applied. In addition, windshield glass 16 is installed in a front end portion of the instrument panel 14, and this windshield glass 16 extends in both a vehicle up-down direction and a vehicle left-right direction, and forms a boundary between the vehicle cabin interior and the vehicle cabin exterior.

A display screen 17, which serves as a display portion, is set in the windshield glass 16. The display screen 17 is a screen where images are projected from a head-up display 19 (see FIG. 3) onto a portion of the area of the windshield glass 16, and is set in an area of the windshield glass 16 that is located on the vehicle forward side of a driver's seat. Note that the display screen 17 that is serving as a display portion may instead be formed by a display of a car navigation system, or by a meter display.

A steering wheel 18 is provided via steering column (not shown in the drawings) on the driver's seat-side (i.e., on the right side in the drawings) of the instrument panel 14. The steering wheel 18 is provided with a substantially annular rim portion 18A. In addition, a hub portion 18B, which forms a central portion, is provided on an inner circumferential side of the rim portion 18A, and the rim portion 18A and hub portion 18B are joined together by a plurality (three in the present exemplary embodiment) of spoke portions 18C.

The spoke portions 18C are provided in three locations, namely, between the right side of the rim portion 18A and the hub portion 18B, between the left side of the rim portion 18A and the hub portion 18B, and between the lower side of the rim portion 18A and the hub portion 18B. Here, a right-side switch group 20R is provided on the spoke portion 18C between the right side of the rim portion 18A and the hub portion 18B. In addition, a left-side switch group 20L is provided on the spoke portion 18C between the left side of the rim portion 18A and the hub portion 18B. The layouts of the right-side switch group 20R and the left-side switch group 20L are set such that respective switches are grouped together based on the functions that perform. The right-side switch group 20R and the left-side switch group 20L are described below in detail.

Figure 2:
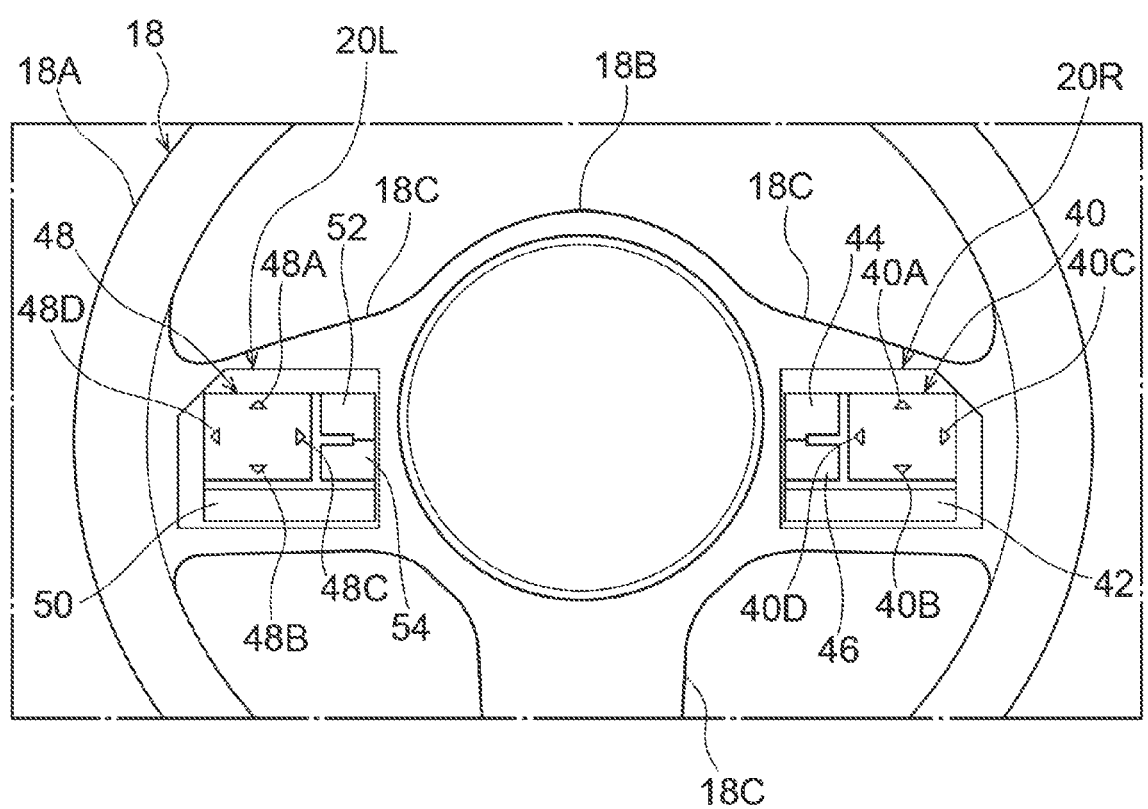
FIG. 2 is an enlarged view of principal portions showing an enlargement of a portion of a steering wheel shown in FIG. 1.

As is shown in FIG. 2, a right-side first tact switch 40 is formed substantially in a circular shape, and is provided with operating portions in the form of an upper button 40A, a lower button 40B, a right button 40C, and a left button 40D. Because of this, the right-side first tact switch 40 is formed so as to be able to be pressed up and down and to the left and right. These buttons are principally used when driving support systems are being operated.

Note that the term 'operation' used here refers to actions such as, for example, pressing an operating portion, touching an operating portion, and moving a finger adjacent to an operating portion and the like. In addition, the term 'vehicle on-board device' used here refers not only to devices such as, for example, an air-conditioner, an audio device, a car navigation system, and a voice input device and the like, but also to driving support systems such as ACC (Active Cruise Control) and LTA (Lane Tracing Assist) and the like.

Moreover, a right-side first electrostatic sensor 41 is provided in the right-side first tact switch 40, and a structure is employed in which it is possible to detect that a vehicle occupant has touched the right-side first tact switch 40. More specifically, a structure is employed in which it is possible to detect which button out of the upper button 40A, the lower button 40B, the right button 40C, and the left button 40D on the right-side first tact switch 40 a vehicle occupant has touched. Note that, in a case in which the images (at least one of icons and/or text) displayed on the display screen 17 are switched, then different functions may be reallocated to the upper button 40A, the lower button 40B, the right button 40C, and the left button 40D.

A right-side second tact switch 42 is disposed on the lower-right side of the right-side first tact switch 40 when the steering wheel 18 is looked at from front-on. This right-side second tact switch 42 is formed in a substantially circular shape having a smaller diameter than the right-side first tact switch 40. Moreover, in the present exemplary embodiment, the right-side second tact switch 42 is allocated the function of switching the images displayed on the display screen 17 upon being pressed. In other words, the hierarchy displayed on the display screen 17 is switched. In addition, a right-side second electrostatic sensor 43 is provided in the right-side second tact switch 42, and a structure is employed in which it is possible to detect that a vehicle occupant has touched the right-side second tact switch 42.

A right-side third tact switch 44 is disposed on the upper-left side of the right-side first tact switch 40 when the steering wheel 18 is looked at from front-on. This right-side third tact switch 44 is formed in a substantially rectangular shape having a cut-away lower-right corner. Moreover, in the present exemplary embodiment, the right-side third tact switch 44 is allocated the function of operating the ACC (Active Cruise Control) upon being pressed. In addition, a right-side third electrostatic sensor 45 is provided in the right-side third tact switch 44, and a structure is employed in which it is possible to detect that a vehicle occupant has touched the right-side third tact switch 44.

A right-side fourth tact switch 46 is disposed underneath the right-side third tact switch 44. This right-side fourth tact switch 46 is formed in a substantially rectangular shape having a cut-away upper-right corner. Moreover, in the present exemplary embodiment, the right-side fourth tact switch 46 is allocated the function of operating the LTA (Lane Tracing Assist) upon being pressed. In addition, a right-side fourth electrostatic sensor 47 is provided in the right-side fourth tact switch 46, and a structure is employed in which it is possible to detect that a vehicle occupant has touched the right-side fourth tact switch 46.

In contrast, as is shown in FIG. 2, the left-side switch group 20L is provided with a left-side first tact switch 48. The left-side switch group 20L is provided with operating portions in the form of a left-side second tact switch 50, a left-side third tact switch 52, and a left-side fourth tact switch 54, and each of these is formed by a contact detection-type switch. In addition, the left-side switch group 20L is also provided with a left-side first electrostatic sensor 49, a left-side second electrostatic sensor 51, a left-side third electrostatic sensor 53, and a left-side fourth electrostatic sensor 55.

As is shown in FIG. 2, the left-side first tact switch 48 is formed substantially in a circular shape, and is provided with operating portions in the form of an upper button 48A, a lower button 48B, a right button 48C, and a left button 48D. Because of this, the left-side first tact switch 48 is formed so as to be able to be pressed up and down and to the left and right.

Moreover, a left-side first electrostatic sensor 49 is provided in the left-side first tact switch 48, and a structure is employed in which it is possible to detect that a vehicle occupant has touched the left-side first tact switch 48. More specifically, a structure is employed in which it is possible to detect which button out of the upper button 48A, the lower button 48B, the right button 48C, and the left button 48D on the left-side first tact switch 48 a vehicle occupant has touched. Note that different operations are allocated to the upper button 40A, the lower button 40B, the right button 40C, and the left button 40D depending on the hierarchy that is displayed on the display screen 17.

The left-side second tact switch 50 is disposed on the lower-left side of the left-side first tact switch 48 when the steering wheel 18 is looked at from front-on. This left-side second tact switch 50 is formed in a substantially circular shape having a smaller diameter than the left-side first tact switch 48. Moreover, in the present exemplary embodiment, the left-side second tact switch 50 is allocated the function of altering the hierarchy of the images displayed on the display screen 17 upon being pressed. In addition, the left-side second electrostatic sensor 51 is provided in the left-side second tact switch 50, and a structure is employed in which it is possible to detect that a vehicle occupant has touched the left-side second tact switch 50.

The left-side third tact switch 52 is disposed on the upper-right side of the left-side first tact switch 48 when the steering wheel 18 is looked at from front-on. This left-side third tact switch 52 is formed in a substantially rectangular shape having a cut-away lower-left corner. Moreover, the left-side third tact switch 52 is allocated the function of turning up an audio volume upon being pressed. In addition, the left-side third electrostatic sensor 53 is provided in the left-side third tact switch 52, and a structure is employed in which it is possible to detect that a vehicle occupant has touched the left-side third tact switch 52.

The left-side fourth tact switch 54 is disposed underneath the left-side third tact switch 52. This left-side fourth tact switch 54 is formed in a substantially rectangular shape having a cut-away upper-left corner. Moreover, the left-side fourth tact switch 54 is allocated the function of turning down an audio tone upon being pressed. In addition, the left-side fourth electrostatic sensor 55 is provided in the left-side fourth tact switch 54, and a structure is employed in which it is possible to detect that a vehicle occupant has touched the left-side fourth tact switch 54.

(Hardware Structure)

Figure 3:
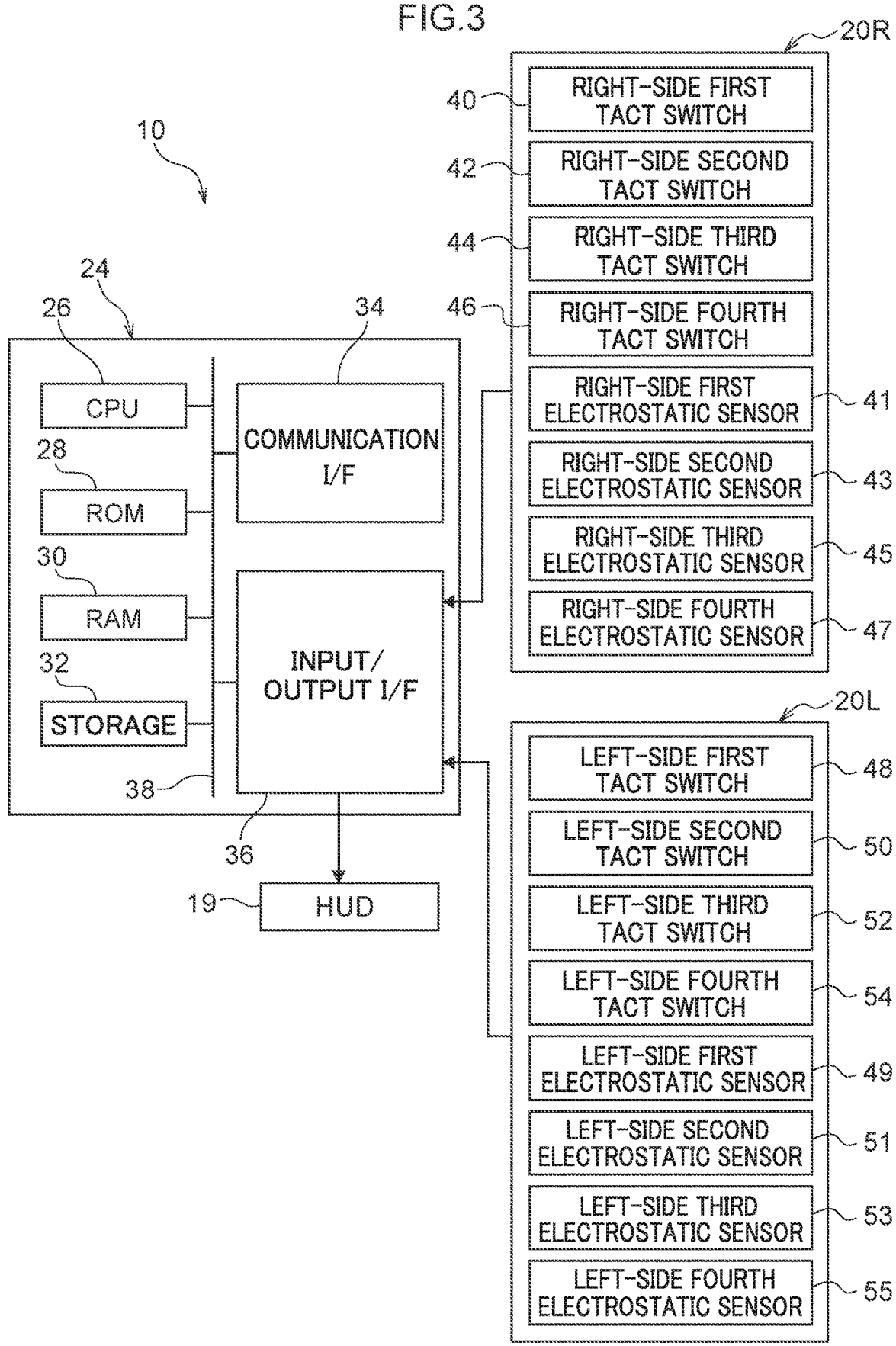
FIG. 3 is a block diagram showing a hardware structure of the display control device according to the exemplary embodiment.

FIG. 3 is a block diagram showing a hardware structure of the display control device 10. As is shown in FIG. 3, the display control device 10 is provided with a control portion in the form of an ECU (Electrical Control Unit) 24. The ECU 24 is formed so as to include a CPU (Central Processing Unit; i.e., a hardware processor) 26, ROM (Read Only Memory) 28, RAM (Random Access Memory) 30, storage 32, a communication interface 34, and an input/output interface 36. These structures are mutually connected together so as to be able to communicate with each other via a bus 38.

The CPU 26 is a central processing unit and performs tasks such as executing various types of programs and controlling the respective units. In other words, the CPU 26 loads a program from the ROM 28 or the storage 32, and executes this program using the RAM 30 as a workspace. The CPU 26 controls the above-described respective structures and performs various types of calculation processing in accordance with programs recorded in the ROM 28 or the storage 32.

The ROM 28 stores various types of programs and various types of data. The RAM 30 serves as a workspace and temporarily stores programs and data. The storage 32 is formed by an HDD (Hard Disk Drive) or an SSD (Solid State Drive), and stores various types of programs including operating systems, and various types of data.

The communication interface 34 is an interface that enables the ECU 24 to communicate with a server and other devices. A Standard such as, for example, Ethernet (Registered Trademark), FDDI, or Wi-Fi (Registered Trademark) is used for the communication interface 34.

The HUD (Head-Up Display) 19, the vehicle on-board devices 39, the right-side switch group 20R, and the left-side switch group 20L are connected to the input/output interface 36. More specifically, the input/output interface 36 is connected to the HUD 19 which projects images onto the display screen 17, and the images from the HUD 19 are projected onto the display screen 17 as a result of a signal being received from the ECU 24. Moreover, in addition to equipment such as the air-conditioner, audio devices, car navigation system, and voice input devices and the like, the vehicle on-board devices 39 also include driving support systems such as ACC (Active Cruise Control) and LTA (Lane Tracing Assist) and the like.

The right-side switch group 20R is provided with the right-side first tact switch 40. The right-side switch group 20R is also provided with operating portions in the form of the right-side second tact switch 42, the right-side third tact switch 44, and the right-side fourth tact switch 46, and each of these is formed by a contact detection-type switch. In addition, the right-side switch group 20R is also provided with the right-side first electrostatic sensor 41, the right-side second electrostatic sensor 43, the right-side third electrostatic sensor 45, and the right-side fourth electrostatic sensor 47.

(Function Structure)

The display control device performs various types of functions by utilizing the hardware resources shown in FIG. 3. The function structures realized by the display control device will now be described using FIG. 4.

Figure 4:
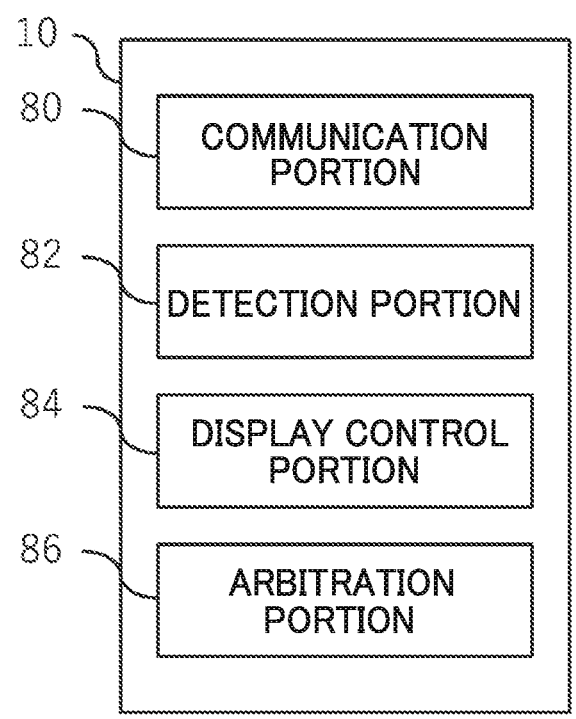
FIG. 4 is a block diagram showing a function structure of the display control device according to the exemplary embodiment.

As is shown in FIG. 4, the display control device 10 is formed so as to include, as function structures, a communication portion 80, a detection portion 82, a display control portion 84, and an arbitration portion 86. Each function structure is realized as a result of the ECU 24 reading, and then executing, a program stored in the ROM 28 or storage 32.

The communication portion 80 performs communication with a server and with devices outside the vehicle through the communication interface 34. The detection portion 82 detects either a contact with, or a movement adjacent to, one of the right-side switch group 20R or the left-side switch group 20L. As a result of this contact with, or movement adjacent to, one of the right-side switch group 20R or the left-side switch group 20L being detected, an input into the vehicle on-board device 39 that corresponds to this right-side switch group 20R or the left-side switch group 20L is detected. More specifically, in the right-side switch group 20R, an input is detected as a result of a signal being received from the right-side first tact switch 40, the right-side second tact switch 42, the right-side third tact switch 44, or the right-side fourth tact switch 46. In the left-side switch group 20L, an input is detected as a result of a signal being received from the left-side first tact switch 48, the left-side second tact switch 50, the left-side third tact switch 52, or the left-side fourth tact switch 54.

The display control portion 84 causes information relating to the vehicle on-board device 39 that corresponds to whichever of the right-side switch group 20R or left-side switch group 20L has been pressed to be displayed on the display screen 17. More specifically, the display control portion 84 provides visual notification to a vehicle occupant by causing information relating to the vehicle on-board device 39 to be displayed on the display screen 17 that is provided on the vehicle front side of the driver's seat. As is described below, the display control portion 84 causes the information relating to the vehicle on-board device 39 to be displayed on the display screen 17 by displaying a GUI (Graphical User Interface) that includes icons.

The arbitration portion 86 arbitrates the display of information on the display screen 17 by the display control unit 84 when the detection portion 82 detects a plurality of contacts with, or movements adjacent to, the right-side switch group 20R or the left-side switch group 20L.

In a case in which the detection portion 82 has detected a plurality of contacts with, or movements adjacent to, the right-side switch group 20R or the left-side switch group 20L, the arbitration portion 86 arbitrates the display of information on the display screen 17 by the display control portion 84 based on a first priority level that has been established for each switch of the right-side switch group 20R and the left-side switch group 20L. The first priority level is a priority level that is set, based on their functions, for each switch of the right-side switch group 20R and the left-side switch group 20L. The first priority level that is set for the right-side switch group 20R which executes functions relating to a function group that supports the driving of the vehicle is set higher than the first priority level that is set for the left-side switch group 20L which executes functions that do not relate to this function group.

In a case in which the detection portion 82 has detected a plurality of contacts with, or movements adjacent to, the right-side switch group 20R or the left-side switch group 20L and the first priority level established for each of the detected switches is the same, the arbitration portion 86 arbitrates the display of information on the display screen 17 by the display control portion 84 based on a second priority level. The second priority level is a priority level that is set, based on their layout positions, for each switch of the right-side switch group 20R and the left-side switch group 20L. When a vehicle occupant operates a plurality of switches of the right-side switch group 20R and the left-side switch group 20L, the second priority level may be set based on a positional relationship between the simultaneously operated switches of the right-side switch group 20R and the left-side switch group 20L. This positional relationship is a relationship that is based on the distance from a home position when the vehicle occupant operates the plurality of switches of the right-side switch group 20R and the left-side switch group 20L. The home position may be the position where a vehicle occupant grips the steering wheel 18.

In a case in which the detection portion 82 has detected a plurality of contacts with, or movements adjacent to, the right-side switch group 20R or the left-side switch group 20L, the arbitration portion 86 may also arbitrate the display of information on the display screen 17 by the display control portion 84 based on the second priority level.

In a case in which the detection portion 82 has detected a plurality of contacts with, or movements adjacent to, the right-side switch group 20R or the left-side switch group 20L, the arbitration portion 86 may also perform arbitration so that the information corresponding to the switch having the highest detection value, as detected by the detection portion 82, is displayed on the display screen 17. The detection values detected by the detection portion 82 may be, for example, capacitance values output by the electrostatic sensor provided for each of the switches.

(Description of the Display Information)

Figure 5:
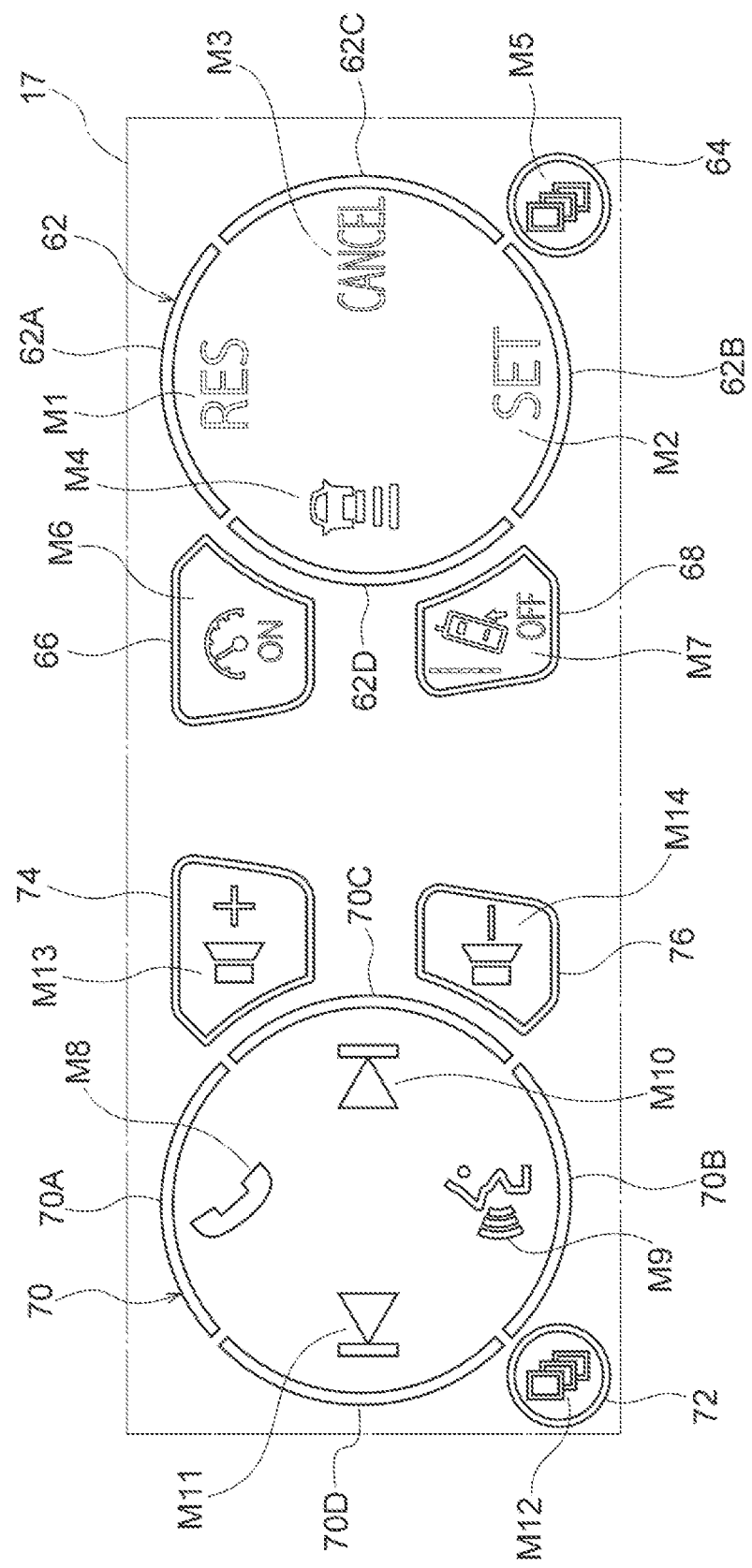
FIG. 5 is a view showing a display example of a display portion in the exemplary embodiment, and shows a first hierarchy of a left-side switch and a first hierarchy of a right-side switch.

Here, an example of the display information displayed on the display screen 17 of the present exemplary embodiment will be described with reference to FIG. 5 through FIG. 8C. FIG. 5 shows images on a first hierarchy menu screen corresponding to the right-side switch group 20R, and images on a first hierarchy menu screen corresponding to the left-side switch group 20L.

A right-side first frame portion 62, which corresponds to the right-side first tact switch 40, is displayed on the right side of the display screen 17. This right-side first frame portion 62 is formed so as include an upper circular-arc portion 62A, a lower circular-arc portion 62B, a right-side circular-arc portion 62C, and a left-side circular-arc portion 62D. The upper circular-arc portion 62A, the lower circular-arc portion 62B, the right-side circular-arc portion 62C, and the left-side circular-arc portion 62D correspond respectively to the upper button 40A, the lower button 40B, the right button 40C, and the left button 40D of the right-side first tact switch 40.

Here, an icon M1 is displayed adjacent to the upper circular-arc portion 62A. This icon M1 is formed so as to resemble a character string 'RES'. In other words, the icon M1 corresponds to a function of RESUME. In addition, an icon M2 is displayed adjacent to the lower circular-arc portion 62B. This icon M2 is formed so as to resemble a character string 'SET'. In other words, the icon M2 corresponds to a function of SET.

An icon M3 is displayed adjacent to the right circular-arc portion 62C. This icon M3 is formed so as to resemble a character string 'CANCEL'. In other words, the icon M3 corresponds to a function of CANCEL. In addition, an icon M4 is displayed adjacent to the left circular-arc portion 62D. This icon M4 is formed so as to resemble a vehicle and radar. In other words, the icon M2 corresponds to a function of detecting information concerning the periphery of a vehicle.

A right-side second frame portion 64, which corresponds to the right-side second tact switch 42, is displayed on the lower right of the right-side first frame portion 62, and an icon M5 is displayed within this right-side second frame portion 64. The icon M5 resembles a shape of overlaid rectangles, and corresponds to a function of altering the hierarchy being displayed on the display screen 17.

A right-side third frame portion 66, which corresponds to the right-side third tact switch 44, is displayed on the upper right of the right-side first frame portion 62. An icon M6 is displayed within this right-side third frame portion 66. The icon M6 is formed so as to resemble a vehicle and a meter, and corresponds to the ACC function.

A right-side fourth frame portion 68, which corresponds to the right-side fourth tact switch 46, is displayed on the lower left of the right-side first frame portion 62. An icon M7 is displayed within this right-side fourth frame portion 68. The icon M7 is formed so as to resemble a vehicle and a lane, and corresponds to an LTA function. These icons M1~M7 are icons of the first hierarchy of the display screen 17 corresponding to the right-side switch group 20R.

In contrast, a left-side first frame portion 70, which corresponds to the left-side first tact switch 48, is displayed on the left side of the display screen 17. This left-side first frame portion 70 is formed so as include an upper circular-arc portion 70A, a lower circular-arc portion 70B, a right-side circular-arc portion 70C, and a left-side circular-arc portion 70D. The upper circular-arc portion 70A, the lower circular-arc portion 70B, the right-side circular-arc portion 70C, and the left-side circular-arc portion 70D correspond respectively to the upper button 48A, the lower button 48B, the right button 48C, and the left button 48D of the left-side first tact switch 48.

Here, an icon M8 is displayed adjacent to the upper circular-arc portion 70A. This icon M8 is formed so as to resemble a telephone. In other words, the icon M1 corresponds to a call function. In addition, an icon M9 is displayed adjacent to the lower circular-arc portion 70B. This icon M9 is formed so as to resemble a state in which a vehicle occupant is talking. In other words, the icon M9 corresponds to a voice recognition function.

An icon M10 is displayed adjacent to the right circular-arc portion 70C. This icon M10 is formed so as to resemble a triangle. Namely, the icon M10 corresponds to a 'play next song' function. In addition, an icon M11 is displayed adjacent to the left circular-arc portion 70D. This icon M11 is formed as a left-right inversion of the icon M10. Namely, the icon M11 corresponds to a 'play previous song' function.

A left-side second frame portion 72, which corresponds to the left-side second tact switch 50, is displayed on the lower left of the left-side first frame portion 70, and an icon M12 is displayed within this left-side second frame portion 72. The icon M12 resembles a shape of overlaid rectangles, and corresponds to a function of altering the hierarchy.

A left-side third frame portion 74, which corresponds to the left-side third tact switch 52, is displayed on the upper right of the left-side first frame portion 70. An icon M13 is displayed within this left-side third frame portion 74. The icon M13 is formed so as to resemble a speaker, and corresponds to an 'increase volume' function.

A left-side fourth frame portion 76, which corresponds to the left-side fourth tact switch 54, is displayed on the lower right of the left-side first frame portion 70. An icon M14 is displayed within this left-side fourth frame portion 76. The icon M14 is formed so as to resemble a speaker, and corresponds to a 'decrease volume' function. These icons M8~M14 are icons of the first hierarchy of the display screen 17 corresponding to the left-side switch group 20L.

Figure 6A:
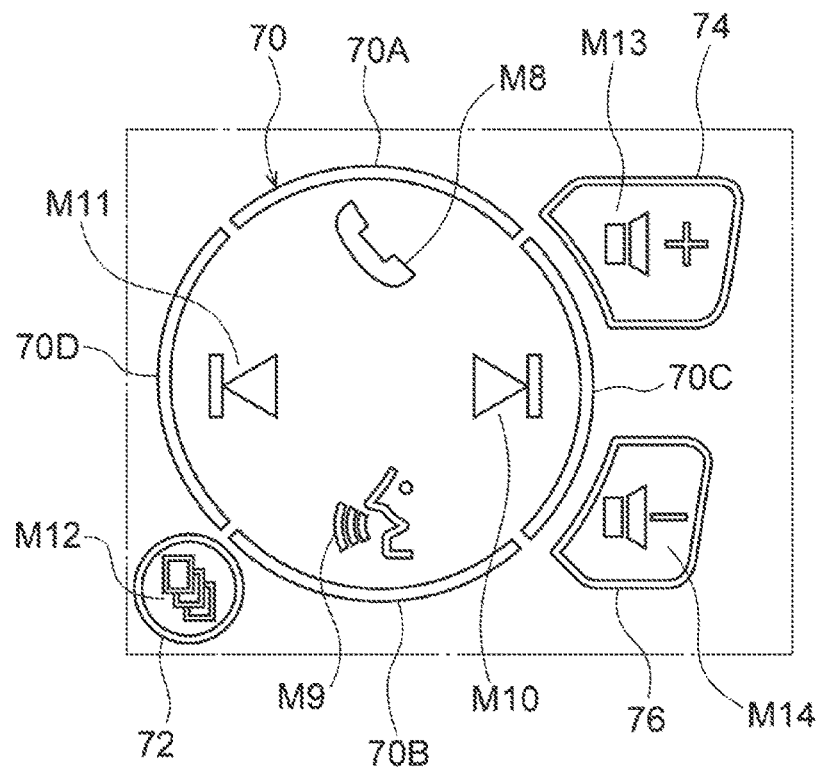
FIG. 6A is a view showing a display example of a head-up display in the exemplary embodiment, and shows a first hierarchy of a left-side switch.

Next, the first hierarchy of the display screen 17 corresponding to the left-side switch group 20L is shown in FIG. 6A. If, in this state, a vehicle occupant presses the left-side second tact switch 50 of the left-side switch group 20L, the display screen 17 is switched to displaying the second hierarchy, which is shown in FIG. 6B.

Figure 6B:
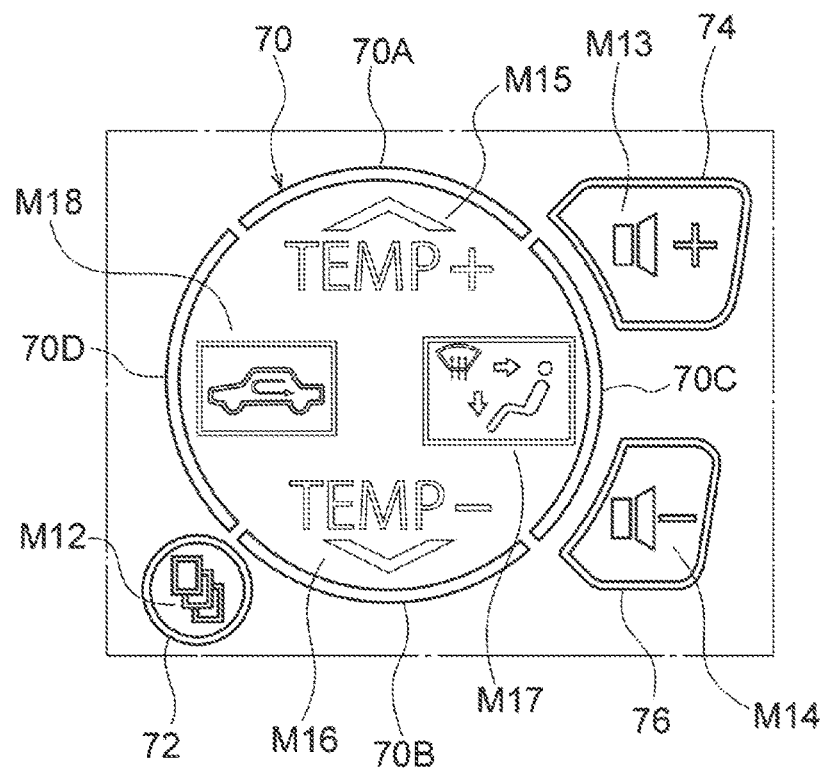
FIG. 6B is a view showing a display example of a head-up display in the exemplary embodiment, and shows a second hierarchy of a left-side switch.

As is shown in FIG. 6B, in the second hierarchy, an icon M15 is displayed instead of the icon M8. The icon M15 is formed so as to resemble a character string 'TEMP+', and corresponds to a function of turning up the air-conditioning temperature. In addition, an icon M16 is displayed instead of the icon M9. The icon M16 is formed so as to resemble a character string 'TEMP-', and corresponds to a function of turning down the air-conditioning temperature.

Furthermore, in the second hierarchy, an icon M17 is displayed instead of the icon M10. The icon M17 is formed so as to resemble a vehicle occupant and a blower direction, and corresponds to a function of altering the blower direction. In addition, an icon M18 is displayed instead of the icon M11. The icon M18 is formed so as to resemble a vehicle, and corresponds to a function of circulating air inside the vehicle. In this way, in the present exemplary embodiment, displays relating to air-conditioning are performed in the second hierarchy of the display screen 17 corresponding to the left-side switch group 20L. Moreover, the detecting portion 82 is formed so as to detect a pressing or touching action on the left-side switch group 20L as an input of an operation that corresponds to the hierarchy currently being displayed on the display screen 17.

Figure 7A:
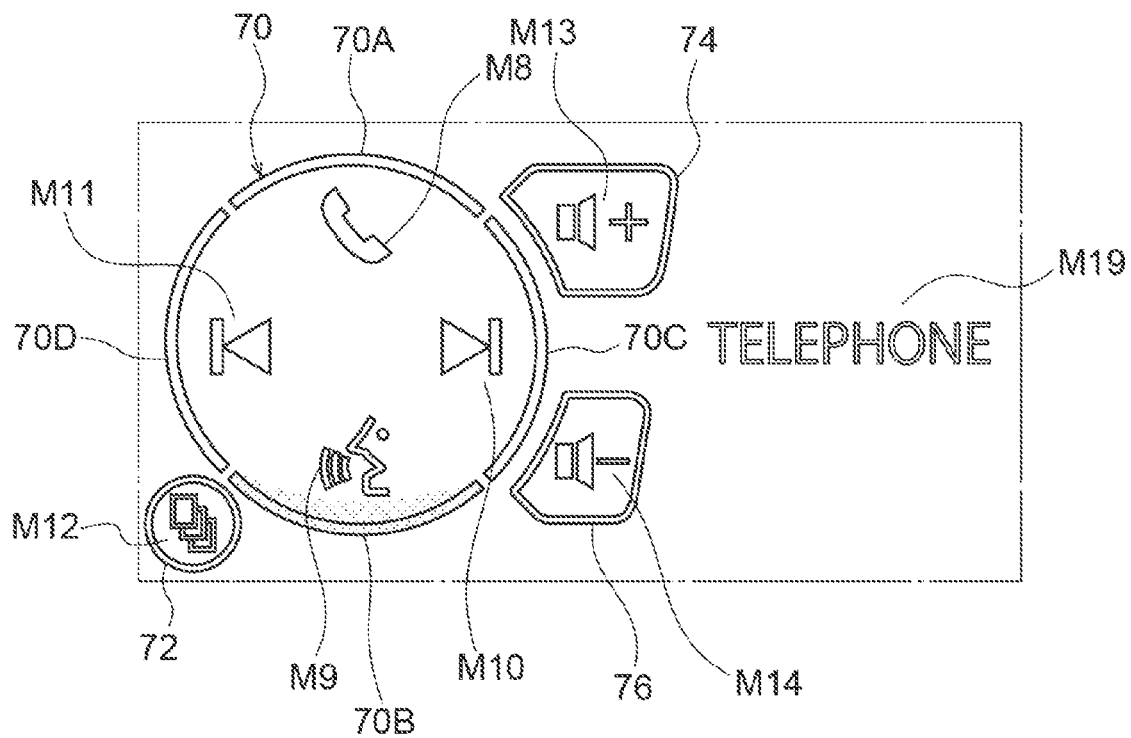
FIG. 7A is a view showing a display example of a head-up display in the exemplary embodiment, and shows a state in which a lower button of a left-side first tact switch is being touched.

Next, FIG. 7A shows the display on the display screen 17 when a vehicle occupant touches the lower button 48B of the left-side first tact switch 48. In other words, the first hierarchy of the display screen 17 corresponding to the left-side switch group 20L is shown in FIG. 7A. The lower circular-arc portion 70B of the left-side first frame portion 70 can be seen displayed in an enhanced display. More specifically, the lower circular-arc portion 70B of the left-side first frame portion 70 and the periphery of the lower circular-arc portion 70B are displayed more brightly. In addition, an icon M19 is displayed in an area on the right side of the left-side third frame portion 74 and the left-side fourth frame portion 76. This icon M19 is formed so as to resemble a character string 'TELEPHONE', which shows that this icon M19 has a communication function. These displays are implemented via the functioning of the display control unit 84, and a structure is employed in which contents that correspond to the lower button 48B that is being touched by a vehicle occupant are displayed. The display control unit 84 also causes the position of the left-side first tact switch 48 that is being touched by the vehicle occupant to be displayed on the display screen 17.

Figure 7B:
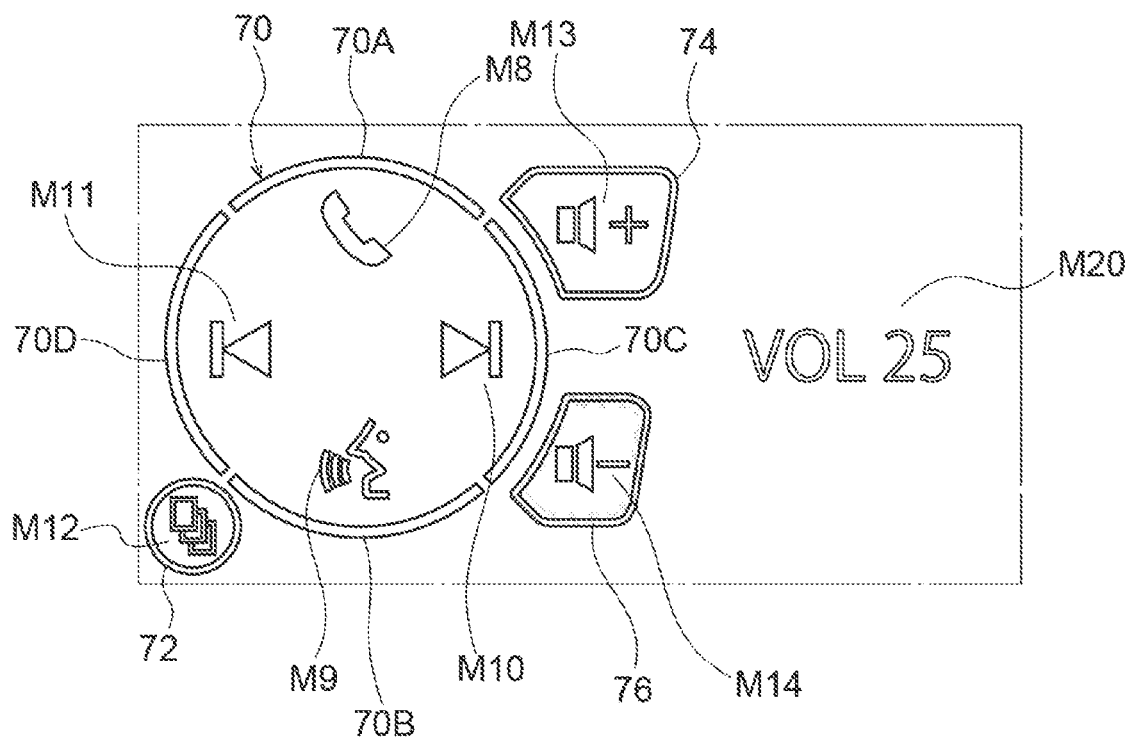
FIG. 7B is a view showing a display example of a head-up display in the exemplary embodiment, and shows a state in which a left-side fourth tact switch is being touched.

FIG. 7B shows the display on the display screen 17 in a state in which a vehicle occupant is touching the left-side fourth tact switch 54. As is shown in FIG. 7B, the first hierarchy of the display screen 17 corresponding to the left-side switch group 20L is displayed. The left-side fourth frame portion 76 is displayed in an enhanced display. More specifically, the left-side fourth frame portion 76 is displayed more brightly. In addition, an icon M20 is displayed in an area on the right side of the left-side third frame portion 74 and the left-side fourth frame portion 76. This icon M20 is formed so as to resemble a character string 'VOL 25', which shows that the audio volume level is set to 25. These displays are implemented via the functioning of the display control unit 84, and a structure is employed in which contents that correspond to the left-side fourth tact switch 54 that is being touched by a vehicle occupant are displayed.

Figure 8A:
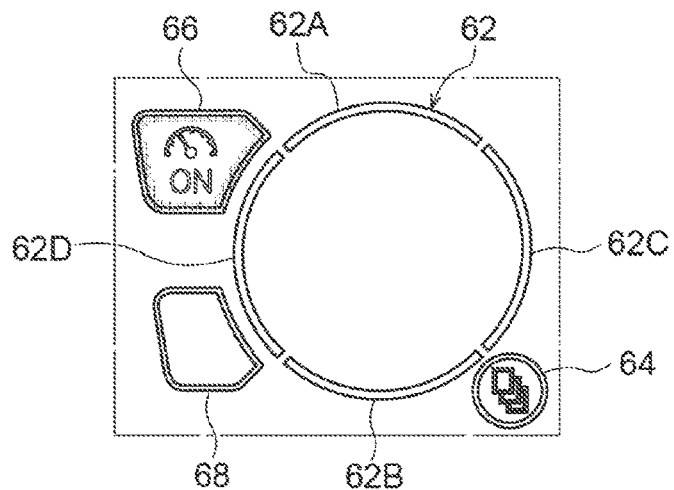
FIG. 8A is a view showing a display example of a head-up display in the exemplary embodiment, and shows a state in which a right-side third tact switch is being touched.

FIG. 8A shows the display on the display screen 17 in a state in which a vehicle occupant is touching the right-side third tact switch 44. As is shown in FIG. 8A, icons for functions that are unable to be selected are hidden from display. In other words, the icons M1~M4 that have been allocated respectively to the upper circular-arc portion 62A, the lower circular-arc portion 62B, the right-side circular-arc portion 62C, and the left-side circular-arc portion 62D of the right-side first frame portion 62 are hidden from display by the functioning of the display control unit 84. Moreover, the icon M7 within the right-side third frame portion 66 is also hidden from display, while the right-side third frame portion 66 is displayed in enhancement. More specifically, the right-side third frame portion 66 is displayed more brightly.

Figure 8B:
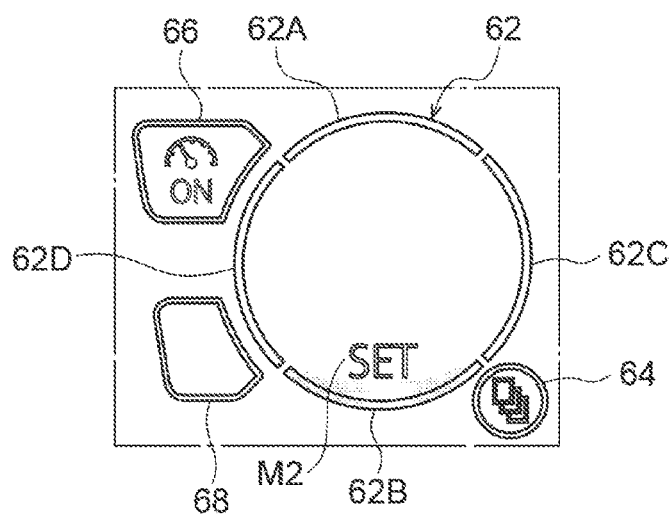
FIG. 8B is a view showing a display example of a head-up display in the exemplary embodiment, and shows a state in which the right-side third tact switch is being pressed, and a lower button of a right-side first tact switch is being touched.

In a case in which a vehicle occupant presses the right-side third tact switch 44 in the state shown in FIG. 8A, the display transitions to the state shown in FIG. 8B. In FIG. 8B, the icon M2 that has been allocated to the lower circular-arc portion 62B of the right-side first frame portion 62 is displayed. Moreover, in FIG. 8B, because a vehicle occupant is touching the lower button 40B of the right-side first tact switch 40, the lower circular-arc portion 62B being displayed on the display screen 17 is displayed in enhancement. More specifically, the lower circular-arc portion 62B and the periphery of the lower circular-arc portion 62B are displayed more brightly.

Figure 8C:
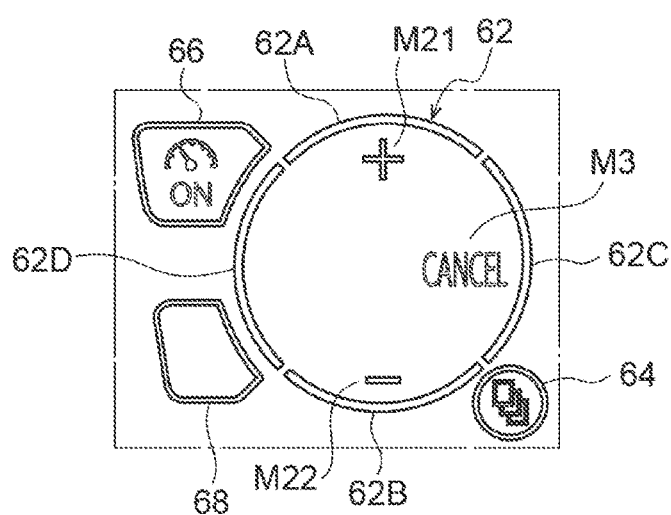
FIG. 8C is a view showing a display example of a head-up display in the exemplary embodiment, and shows a state in which the lower button of the right-side first tact switch is being pressed.

In a case in which a vehicle occupant presses the lower button 40 of the right-side first tact switch 40 in the state shown in FIG. 8B, the ACC operating state is implemented, and the display transitions to the state shown in FIG. 8C. In FIG. 8C, the icon M3 that has been allocated to the right-side circular-arc portion 62C of the right-side first frame portion 62 is displayed. In addition, an icon M21 is displayed in the upper circular-arc portion 62A, and an icon M22 is displayed in the lower circular-arc portion 62B. The icon M21 is formed so as to resemble a character '+', while the icon M22 is formed so as to resemble a character '-'. A structure is consequently created in which, in a case in which the upper button 40A of the right-side first tact switch 40 is pressed, the set speed of the ACC is increased, while in a case in which the lower button 40B of the right-side first tact switch 40 is pressed, the set speed of the ACC is decreased.

(Examples of State Transitions)

Figure 9:
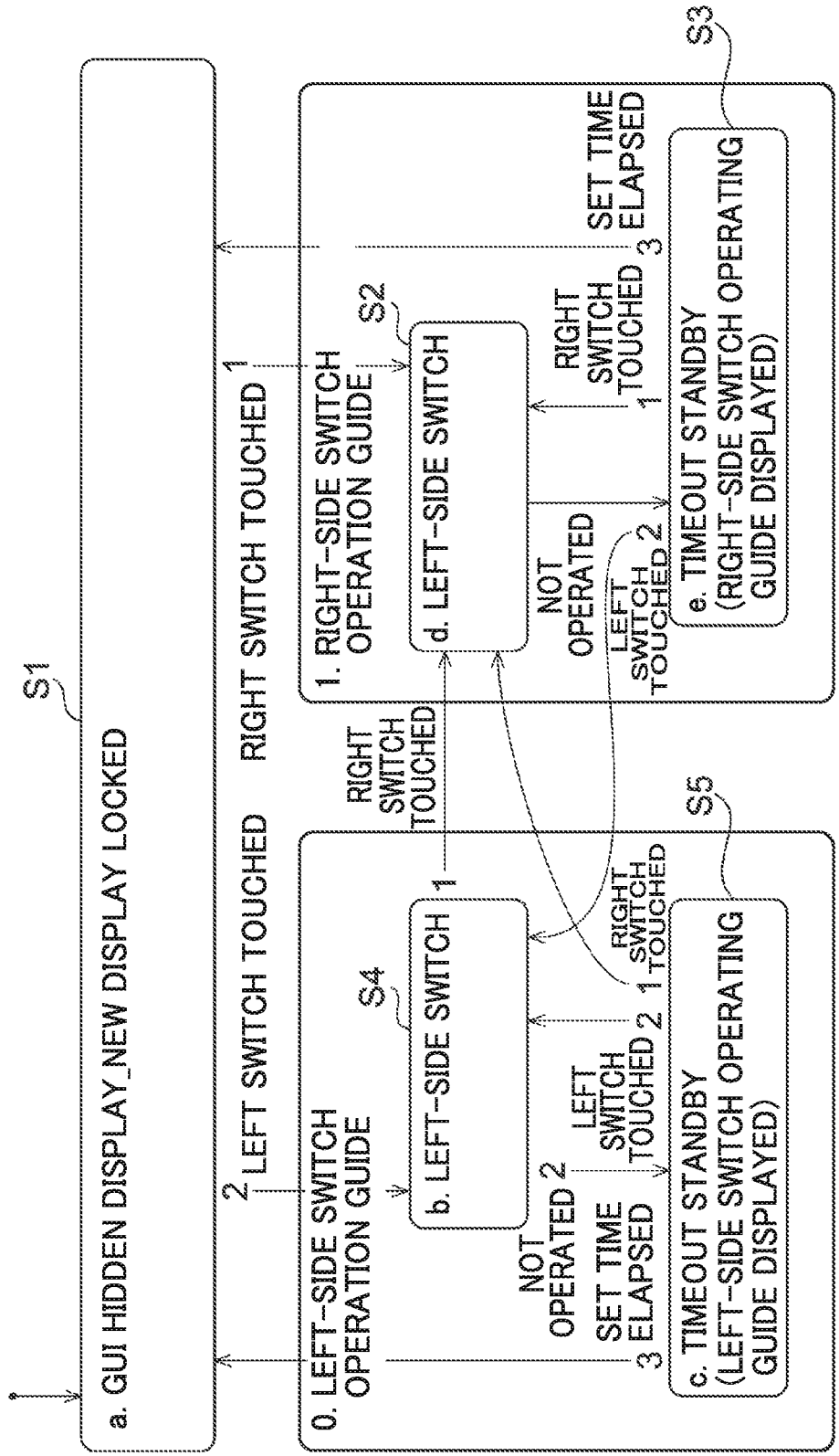
FIG. 9 is a state transition diagram illustrating display processing performed by the display control device according to the exemplary embodiment.

Next, the display processing performed by the display control device 10 will be described with reference to the state transition diagram shown in FIG. 9. In the state transition diagram shown in FIG. 9, in a case in which a numeral is shown at the base of an arrow, this numeral shows the priority level when transitioning from the same state.

In a state S1 in which a vehicle occupant has operated neither the right-side switch group 20R nor the left-side switch group 20L, and no GUI is being displayed on the display screen 17, if a vehicle occupant then operates the right-side switch group 20R, the display control device 10 transitions to the display state S2 of the operated right-side switch group 20R. If, in this display state S2, the vehicle occupant does not then operate the right-side switch group 20R, the display control device 10 transitions to the timeout standby state S3.

In the state S1 in which a vehicle occupant has operated neither the right-side switch group 20R nor the left-side switch group 20L, and no GUI is being displayed on the display screen 17, if a vehicle occupant then operates the left-side switch group 20L, the display control device 10 transitions to the display state S4 of the operated left-side switch group 20L. If, in this display state S4, the vehicle occupant then operates the right-side switch group 20R, the display control device 10 transitions to the display state S2 of the operated right-side switch group 20R. If, in the display state S4, the vehicle occupant does not operate the left-side switch group 20L, the display control device 10 transitions to the timeout standby state S5.

In the state S1 in which a vehicle occupant has operated neither the right-side switch group 20R nor the left-side switch group 20L, and no GUI is being displayed on the display screen 17, it will be assumed that the vehicle occupant has operated the right-side switch group 20R and the left-side switch group 20L. In this case, because the priority level of the transition to the display state S2 is higher, the display control device 10 transitions to the display state S2 of the operated right-side switch group 20R.

In the timeout standby state S3, it will be assumed that the vehicle occupant has operated the right-side switch group 20R and the left-side switch group 20L at the same time. In this case, because the priority level of the transition to the display state S2 is higher, the display control device 10 transitions to the display state S2 of the operated right-side switch group 20R. If the vehicle occupant only operates the left-side switch group 20L, the display control device 10 transitions to the state S4. In the timeout standby state S3, if the vehicle occupant does not touch any switch for a predetermined length of time, the display control device 10 returns to the state S1.

In the timeout standby state S5, it will be assumed that the vehicle occupant has operated the right-side switch group 20R and the left-side switch group 20L at the same time. In this case, because the priority level of the transition to the display state S2 is higher, the display control device 10 transitions to the display state S2 of the operated right-side switch group 20R. If the vehicle occupant only operates the left-side switch 20L, the display control device 10 transitions to the state S4. In the timeout standby state S5, if the vehicle occupant does not touch any switch for a predetermined length of time, the display control device 10 returns to the state S1.

(Example of Display Processing)

Next, an example of a flow of display processing performed by the display control device 10 will be described with reference to the flowchart shown in FIG. 10. This display processing is executed when, for example, an ignition switch (i.e., the power) of the vehicle 12 is turned ON, and is implemented as a result of the CPU 26 reading a program stored in the ROM 28 or the storage 32, and then expanding and subsequently executing the program in the RAM 30.

The CPU 26 determines whether or not a vehicle occupant has either made contact with, or brought their finger adjacent to, at least one of the right-side switch group 20R or the left-side switch group 20L (step S101). More specifically, in a case in which a signal has been received from the right-side first electrostatic sensor 41, the right-side second electrostatic sensor 43, the right-side third electrostatic sensor 45, or the right-side fourth electrostatic sensor 47, it is determined, as a result of a function performed by the detection portion 82, that a vehicle occupant has touched the right-side switch group 20R. In the same way, in a case in which a signal has been received from the left-side first electrostatic sensor 49, the left-side second electrostatic sensor 51, the left-side third electrostatic sensor 53, or the left-side fourth electrostatic sensor 55, it is determined that a vehicle occupant has touched the left-side switch group 20L.

In step S101, if it is not detected that a vehicle occupant has either made contact with, or brought their finger adjacent to, at least one of the right-side switch group 20R or the left-side switch group 20L (S101: NO), then the CPU 26 ends the processing routine. If, however, in step S101, it is detected that a vehicle occupant has either made contact with, or brought their finger adjacent to, at least one of the right-side switch group 20R or the left-side switch group 20L (S101: YES), then the CPU 26 determines whether or not a plurality of contacts have been detected (step S102).

If, in step S102, a plurality of contacts have not been detected (S102: NO), the CPU 26 displays information for the detected switch on the display screen 17 (step S103). If, ever, in step S103, it is detected that a plurality of contacts have been detected (S102: YES), then the CPU 26 determines whether or not the first priority levels of the detected switches are the same (step S104).

If, in step S104, the first priority levels of the detected switches are not the same (step S104: NO), then the CPU 26 displays the information for the switch having the highest first priority level of the detected switches on the display screen 17 (step S105). If, on the other hand, the first priority levels of the detected switches are the same (step S104: YES), the CPU 26 determines whether or not the second priority levels of the detected switches are the same (step S106).

If, in step S106, the second priority levels of the detected switches are not the same (step S106: NO), then the CPU 26 displays the information for the switch having the highest second priority level of the detected switches on the display screen 17 (step S105). If, on the other hand, the second priority levels of the detected switches are the same (step S106: YES), the CPU 26 displays the information for the switch having the highest detection value of the detected switches on the display screen 17 (step S107). The detection value is, for example, the capacitance of the electrostatic sensor.

Figure 10:
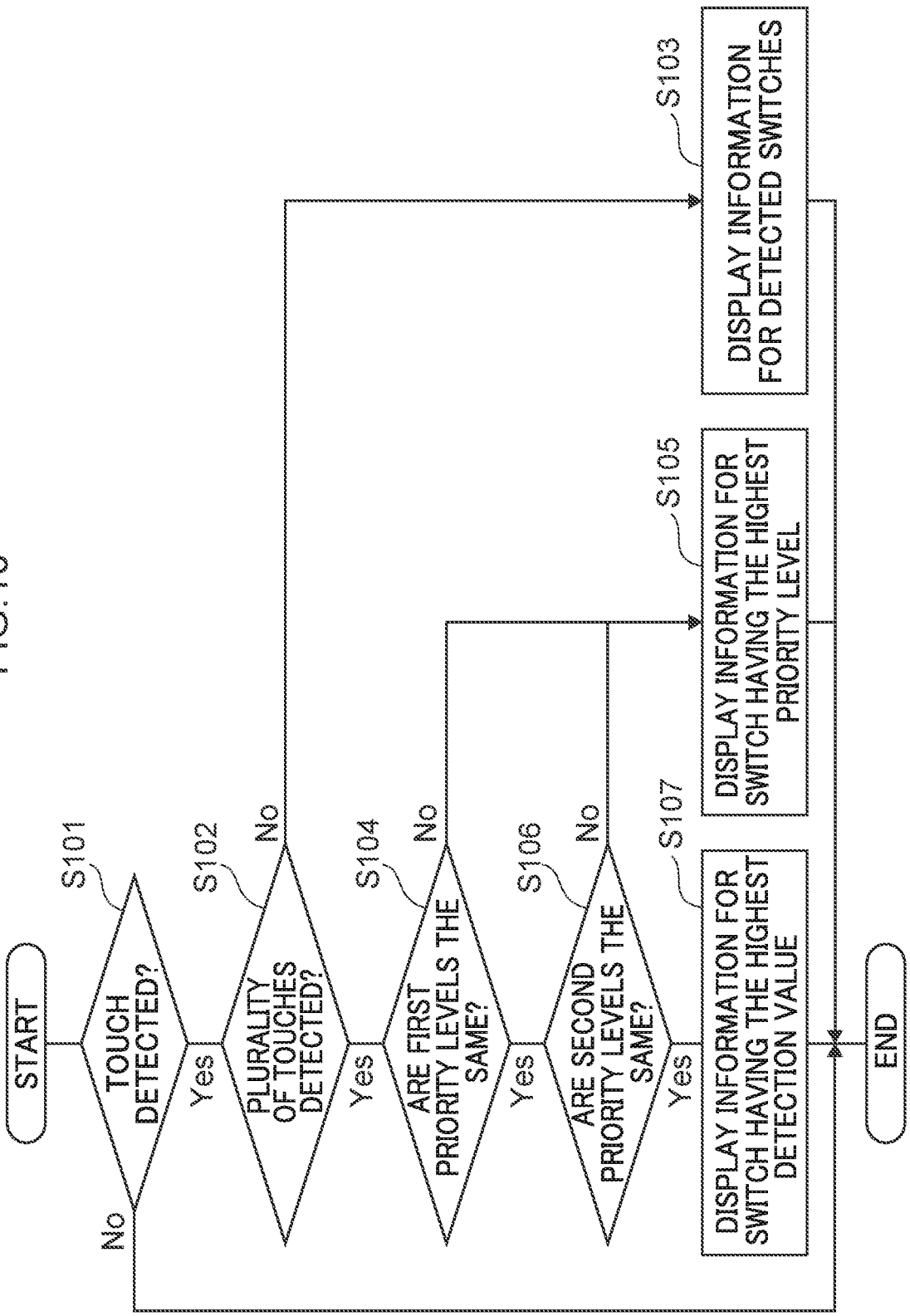
FIG. 10 is a flowchart illustrating display processing performed by the display control device according to the exemplary embodiment.

As a result of the CPU 26 executing the operating sequence shown in FIG. 10, when a plurality of switches are operated, it is possible to perform arbitration so that only a single set of information is displayed. When a plurality of switches are operated, as a result of the CPU 26 performing arbitration so that only a single set of information is displayed, it is possible to inhibit a vehicle occupant from feeling overwhelmed by the display of too much information, and to inhibit a display from being incorrectly recognized.

(Example of a Priority Level)

Figure 11:
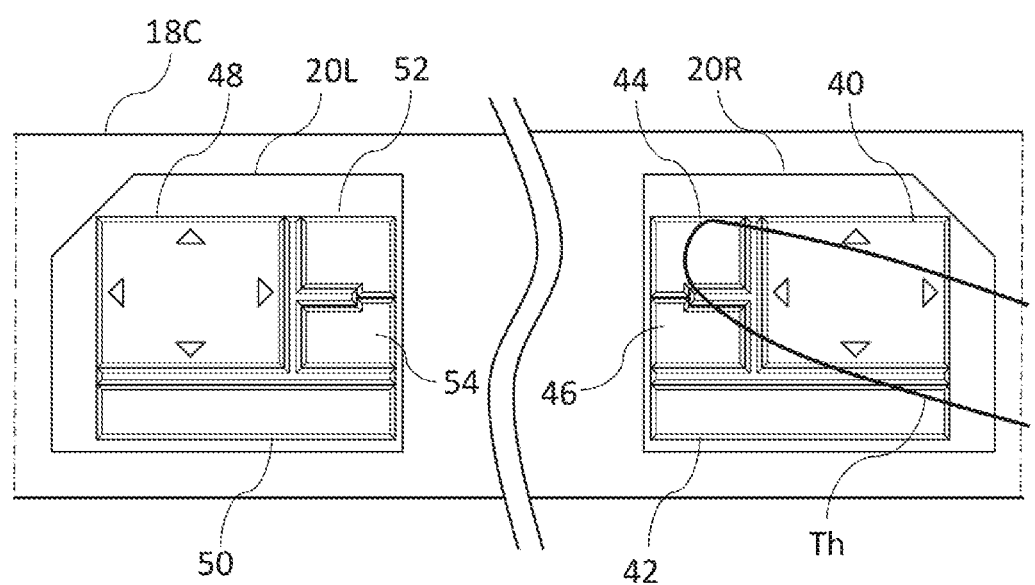
FIG. 11 is a view showing an example of an operation of a switch by a vehicle occupant.

FIG. 11 is a view showing an example of a switch group being operated by a vehicle occupant. A symbol Th represents a thumb of the vehicle occupant.

In the present exemplary embodiment, the first priority level set in the right-side switch group 20R is set higher than the first priority level set in the left-side switch group 20L. Accordingly, when a vehicle occupant operates both the right-side switch group 20R and the left-side switch group 20L at the same time, the right-side switch group 20L is given precedence and the information thereof is displayed on the display screen 17.

In addition, in the present exemplary embodiment, when a vehicle occupant operates a button, the second priority level is raised proportionally as the possibility that the thumb th will touch a plurality of buttons at the same time increases. In other words, the closer a switch is located to the tip of the thumb th of the vehicle occupant, the greater the priority level that is given to this switch. As a result, the display control device 10 is able to estimate which switch the vehicle occupant intended to operate.

In the present exemplary embodiment, in the right-side switch group 20R, the second priority level of the right-side third tact switch 44 is set the highest, and thereafter the second priority level decreases in the sequence of the right-side fourth tact switch 46, then the right-side second tact switch 42, and then the right-side first tact switch 40. In the same way, in the left-side switch group 20L, the second priority level of the left-side third tact switch 53 is set the highest, and thereafter the second priority level decreases in the sequence of the left-side fourth tact switch 54, then the left-side second tact switch 50, and then the left-side first tact switch 48.

In addition, the display control device 10 displays, on the display screen 17, information for the switch having the highest detection value of the detected switches out of the right-side first tact switch 40, in which a plurality of switches are provided, and the left-side first tact switch 48.

(Variant Examples of Switches)

Figure 12:
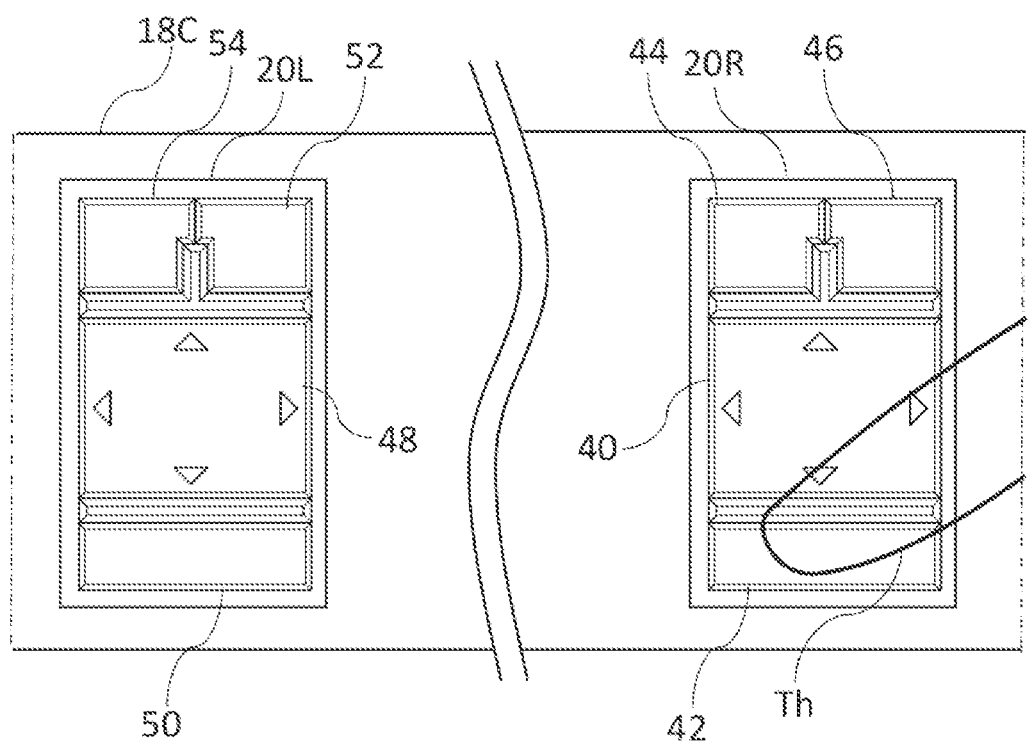
FIG. 12 is a view showing a variant example of layouts of a right-side switch and a left-side switch.

FIG. 12 shows a variant example of a layout of each switch of the right-side switch group 20R and the left-side switch group 20L. Even in a case in which the right-side switch group 20R and the left-side switch group 20L are arranged in a layout such as is shown in FIG. 12, the first priority level set in the right-side switch group 20R is set higher than the first priority level set in the left-side switch group 20L. In addition, the second priority level of the respective switches are set in the same way as that described above.

In the present exemplary embodiment, the first priority level that is set in the right-side switch group 20R is set higher than the first priority level set in the left-side switch group 20L, however, it is also possible to make it possible for a vehicle occupant to select which of the right-side switch group 20R and the left-side switch group 20L is to have the higher first priority level.

Note that in the above-described exemplary embodiment, it is also possible for the display processing executed by the CPU after reading software (i.e., a program) to instead be executed by various types of processors other than a CPU. Examples of other types of processors in this case include PLD (Programmable Logic Devices) whose circuit structure can be altered after manufacturing such as an FPGA (Field-Programmable Gate Array), and dedicated electrical circuits and the like which are processors having a circuit structure that is designed specifically in order to execute a particular processing such as ASIC (Application Specific Integrated Circuits). In addition, the display processing may be executed by just one type from among these various types of processors, or by a combination of two or more processors that are either the same type or are mutually different types (for example by a plurality of FPGA or by a combination of a CPU and an FPGA). Furthermore, the hardware structures of these different types of processors are, more specifically, electrical circuits obtained by combining circuit elements such as semiconductor elements and the like.

Moreover, in the above-described exemplary embodiment, a mode in which the display processing program is stored (i.e., installed) in advance in ROM or on storage is described, however, the present disclosure is not limited to this. It is also possible for the program to be provided in a mode in which it is recorded on a non-transitory recording medium such as a CD-ROM (Compact Disc Read Only Memory), a DVD-ROM (Digital Versatile Disc Read Only Memory), or a USB (Universal Serial Bus) memory. Moreover, it is also possible to enable each program to be downloaded from an external device via a network.

An exemplary embodiment of the present disclosure has been described above, however, the present disclosure is not limited to this. Various modifications and the like may be made to the present disclosure insofar as that do not depart from the spirit or scope of the present disclosure.

The present disclosure was conceived in view of the above-described problems, and it is an object thereof to provide a display control device, a display control method, and a display control system that, in a case in which it is detected that a finger has made contact with, or has been moved adjacent to a plurality switches at the same time, make it possible to inhibit a vehicle occupant from feeling overwhelmed by the display of too much information, and to inhibit a display from being incorrectly recognized.

A first aspect of the disclosure is a display control device that includes a memory, and a processor that is coupled to the memory, the processor being configured to in a case in which a contact with, or a movement adjacent to, any of a plurality of operating portions provided inside a vehicle cabin is detected, display information corresponding to that operating portion on a display portion inside the vehicle cabin, and, in a case in which a contact with, or a movement adjacent to, two or more of the operating portions is detected, arbitrate the displaying of information on the display portion.

According to the display control device of the first aspect, in a case in which it is detected that a finger has made contact with, or has been moved adjacent to a plurality switches at the same time, it is possible to inhibit a vehicle occupant from feeling overwhelmed by the display of too much information, and to inhibit a display from being incorrectly recognized.

A second aspect of the disclosure is the display control device of the first aspect, wherein the processor is configured to arbitrate to display information corresponding to an operating portion having a highest first priority level that has been set for each of the operating portions based on their function on the display portion.

A third aspect of the disclosure is the display control device of the second aspect, wherein the processor is configured to arbitrate, in a case in which the two or more of the operating portions for which a contact with, or a movement adjacent to, has been detected have a same first priority level, to display information corresponding to an operating portion having a highest second priority level that has been set for each of the operating portions based on their layout positions on the display portion.

A fourth aspect of the disclosure is the display control device of the second aspect, wherein a first priority level that is set for operating portions that execute functions relating to a function group that supports driving of a vehicle is set higher than a first priority level that is set for operating portions that execute functions that do not relate to the function group.

A fifth aspect of the disclosure is the display control device of the fourth aspect, wherein the operating portions that execute functions relating to the function group are provided on one side of a steering wheel that is provided on a vehicle front side of a driver's seat.

A sixth aspect of the disclosure is the display control device of the first aspect, wherein the processor is configured to arbitrate to display information corresponding to an operating portion having a highest second priority level that has been set for each of the operating portions based on their layout positions on the display portion.

A seventh aspect of the disclosure is the display control device of the sixth aspect, when a vehicle occupant operates the plurality of operating portions, the second priority level is set based on a positional relationship between simultaneously operated operating portions.

An eighth aspect of the disclosure is the display control device of the seventh aspect, wherein the positional relationship is a relationship that is based on a distance from a home position when the vehicle occupant operates the plurality of operating portions.

A ninth aspect of the disclosure is the display control device of the third aspect, wherein the processor is configured to arbitrate, in a case in which the two or more of the operating portions for which a contact with, or a movement adjacent to, has been detected have a same second priority level, to display information corresponding to an operating portion having a highest detection value is displayed on the display portion.

A tenth aspect of the disclosure is the display control device of the first aspect, wherein layouts of the operating portions are set such that the operating portions are grouped together based on functions that perform.

An eleventh aspect of the disclosure is the display control device of the first aspect, wherein the processor is configured to, after starting to display the information on the display portion, continue to display the information on the display portion for a predetermined time.

A twelfth aspect of the disclosure is the display control device of the eleventh aspect, wherein the processor is configured to, in a case in which a contact with, or a movement adjacent to, the operating portion is detected while the information is being displayed on the display portion, switch the display on the display portion to information that corresponds to this new detection.

A thirteenth aspect of the disclosure is the display control device of the first aspect, wherein the plurality of operating portions are provided at a steering wheel that is disposed on a vehicle front side of a driver's seat.

A fourteenth aspect of the disclosure is the display control device of the first aspect, wherein the processor is configured to display on the display portion at least one of icons or text that represent vehicle on-board devices that have been allocated to the operating portions.

A fifteenth aspect of the disclosure is the display control device of the first aspect, wherein the display portion is at least any one of a head-up display, a meter, or a car navigation system.

A sixteenth aspect of the disclosure is a display control method that includes, by a processor, in a case in which a contact with, or a movement adjacent to, any of a plurality of operating portions provided inside a vehicle cabin is detected, displaying information corresponding to that operating portion on a display portion inside the vehicle cabin; and, in a case in which a contact with, or a movement adjacent to, two or more of the operating portions is detected, arbitrating the displaying of information on the display portion.

A seventeenth aspect of the disclosure is the display control system that includes a display device that includes a display portion, and a display control device that includes a memory, and a processor that is coupled to the memory, the processor being configured to, in a case in which a contact with, or a movement adjacent to, any of a plurality of operating portions provided inside a vehicle cabin is detected, display information corresponding to that operating portion on a display portion inside the vehicle cabin, and, in a case in which a contact with, or a movement adjacent to, two or more of the operating portions is detected, arbitrate the displaying of information on the display portion.

According to the present disclosure, it is possible to provide a display control device, a display control method, and a display control system that, in a case in which it is detected that a finger has made contact with, or has been moved adjacent to a plurality switches at the same time, make it possible to inhibit a vehicle occupant from feeling overwhelmed by the display of too much information, and to inhibit a display from being incorrectly recognized.

What is claimed is:

1. A display control device comprising:
   a memory; and
   a processor that is coupled to the memory,
   the processor being configured to:
   responsive to detection of a contact with, or a movement adjacent to, any one of a plurality of operating portions inside a vehicle cabin, wherein there are a plurality of switches having different functions on left and right spokes of a steering wheel, each separated from the other and each with at least two of the operating portions, display information corresponding to the one of the plurality of operating portions on a display inside the vehicle cabin, and
   responsive to detection of a contact with, or a movement adjacent to, two or more of the plurality of operating portions, perform an arbitration to display information on the display corresponding to only one of the two or more of the operating portions, wherein
   the arbitration is determined upon a highest first priority level that has been set for each of the operating portions based on a respective function of each of the operating portions, the respective function being for a vehicle on-board device and being executable based on operation of a respective one of the operating portions, and
   the first priority level that is set for operating portions that execute functions relating to a function group that supports driving of a vehicle is higher than the first priority level for operating portions that execute functions that do not relate to the function group.

2. The display control device according to claim 1, wherein the operating portions that execute functions relating to the function group are on one side of a steering wheel that is on a vehicle front side of a driver's seat.

3. The display control device according to claim 1, wherein the arbitration causes information to be displayed corresponding to an operating portion having a highest second priority level that has been set for each of the operating portions based on their layout positions on the display.

4. The display control device according to claim 3, wherein a vehicle occupant operates the plurality of operating portions, the second priority level is set based on a positional relationship between simultaneously operated operating portions.

5. The display control device according to claim 4, wherein the positional relationship is based on a distance from a home position.

6. The display control device according to claim 1, wherein the two or more of the operating portions for which a contact with, or a movement adjacent to, has been detected have a same second priority level, and information corresponding to an operating portion having a highest detection value is displayed on the display.

7. The display control device according to claim 1, wherein layouts of the operating portions are set such that the operating portions are grouped together based on functions that are performed.

8. The display control device according to claim 1, wherein the processor is configured to, after starting to display the information on the display, continue to display the information on the display for a predetermined time.

9. The display control device according to claim 8, wherein the processor is configured to, responsive to a new detection of a contact with, or a movement adjacent to, the operating portion while the information is being displayed on the display, switch the display to information that corresponds to the new detection.

10. The display control device according to claim 1, wherein the plurality of operating portions are at a steering wheel that is on a vehicle front side of a driver's seat.

11. The display control device according to claim 1, wherein the processor is configured to display on the display at least one of icons or text that represent vehicle on-board devices that have been allocated to the operating portions.

12. The display control device according to claim 1, wherein the display is at least one of a head-up display, a meter, or a car navigation system.

13. The display control device according to claim 1, wherein the plurality of operating portions are not elements of the display.

14. A display control method comprising, by a processor:
responsive to detection of a contact with, or a movement adjacent to, any one of a plurality of operating portions inside a vehicle cabin, wherein there are a plurality of switches having different functions on left and right spokes of a steering wheel, each separated from the other and each with at least two of the operating portions, displaying information corresponding to the one of the plurality operating portions on a display inside the vehicle cabin; and
responsive to detection of a contact with, or a movement adjacent to, two or more of the plurality operating portions, performing an arbitration to display information on the display corresponding to only one of the two or more of the operating portions; wherein
the arbitration is determined upon a highest first priority level that has been set for each of the operating portions based on a respective function of each of the operating portions, the respective function being for a vehicle on-board device and being executable based on operation of a respective one of the operating portions; and
the first priority level that is set for operating portions that execute functions relating to a function group that supports driving of a vehicle is higher than the first priority level for operating portions that execute functions that do not relate to the function group.

15. The display control method according to claim 14, wherein the plurality of operating portions are not elements of the display.

16. A display control system comprising:
a display inside a vehicle cabin; and
a display control that includes:
a memory; and
a processor that is coupled to the memory,
the processor being configured to:
responsive to detection of a contact with, or a movement adjacent to, any one of a plurality of operating portions inside the vehicle cabin, wherein there are a plurality of switches having different functions on left and right spokes of a steering wheel, each separated from the other and each with at least two of the operating portions, display information corresponding to the one of the plurality operating portions on the display, and
responsive to detection of a contact with, or a movement adjacent to, two or more of the plurality of operating portions, perform an arbitration to display information on the display corresponding to only one of the two or more of the operating portions, wherein
the arbitration is determined upon a highest first priority level that has been set for each of the operating portions based on a respective function of each of the operating portions, the respective function being for a vehicle on-board device and being executable based on operation of a respective one of the operating portions, and
the first priority level that is set for operating portions that execute functions relating to a function group that supports driving of a vehicle is higher than the first priority level for operating portions that execute functions that do not relate to the function group.

17. The display control system according to claim 16, wherein the plurality of operating portions are not elements of the display.

* * * * *